(12) United States Patent
Moriguchi et al.

(10) Patent No.: US 6,278,080 B1
(45) Date of Patent: Aug. 21, 2001

(54) POWER SUPPLY APPARATUS

(75) Inventors: Haruo Moriguchi, Itami; Tetsuro Ikeda; Atsushi Kinoshita, both of Osaka; Hideo Ishii, Minoo, all of (JP)

(73) Assignee: Sansha Electric Manufacturing Company Limited, Osaka (JP)

( * ) Notice: Subject to any disclaimer, the term of this patent is extended or adjusted under 35 U.S.C. 154(b) by 0 days.

(21) Appl. No.: 09/440,053

(22) Filed: Nov. 18, 1999

(30) Foreign Application Priority Data

Nov. 26, 1998 (JP) .................................................. 10-335375

(51) Int. Cl.$^7$ ............................... B23K 9/10; H02M 1/00
(52) U.S. Cl. ......................................... 219/130.1; 363/141
(58) Field of Search ........................... 219/130.1, 130.31, 219/130.32, 130.33, 137 PS; 363/141

(56) References Cited

U.S. PATENT DOCUMENTS

| | | | |
|---|---|---|---|
| 3,059,164 | * 10/1962 | Johnson | 219/130.1 |
| 5,045,670 | * 9/1991 | Gilliland | 219/130.1 |
| 5,250,786 | * 10/1993 | Kikuchi et al. | 219/130.32 |
| 5,825,642 | 10/1998 | Ishii et al. | |

FOREIGN PATENT DOCUMENTS

703291 * 2/1965 (CA) .................................. 219/130.1

* cited by examiner

*Primary Examiner*—Clifford C. Shaw
(74) *Attorney, Agent, or Firm*—Duane, Morris & Heckscher LLP

(57) ABSTRACT

A power supply apparatus includes a power supply unit disposed within a casing. The power supply unit includes power semiconductor devices. A fan is provided in the casing for cooling the power semiconductor devices. The power supply unit is operated in a plurality of contiguous cycles each including a running and pausing modes of operation. Each cycle lasting a relatively short time period. The power supply unit operates in the running mode and the pausing mode, respectively in response to the closing and opening of a start switch. In association with the closing and opening of the start switch, a switch for the cooling fan causes the fan to rotate and stop, respectively, which results in minimizing the difference between the highest and lowest temperatures of the power semiconductor devices so that the lifetime of the power semiconductor devices can be prolonged.

3 Claims, 4 Drawing Sheets

POWER SUPPLY APPARATUS

This invention relates to a power supply apparatus for, for example, welders, cutters and projectors, which alternates between a running mode of operation and a pausing mode of operation in a plurality of cycles having a relatively short time period.

BACKGROUND OF THE INVENTION

An example of such power supply apparatus includes an input-side AC-to-DC converter which converts a commercial AC voltage to a DC voltage. The DC voltage is applied to an inverter where it is converted to a high-frequency voltage, which, in turn, is applied to a voltage transformer. The voltage transformer transforms the high-frequency voltage to a high-frequency voltage having a predetermined value. The voltage-transformed high-frequency voltage from the transformer is converted back to a DC voltage in an output-side high-frequency-to-DC converter. The resulting DC voltage is applied to a load.

The input-side AC-to-DC converter and the output-side high-frequency-to-DC converter each include at least one diode. The inverter includes at least one semiconductor switching device, e.g. an IGBT.

Since the described power supply apparatus includes an inverter, it can use small-sized reactors in the transformer and the output-side high-frequency-to-DC converter, which enables the downsizing of the power supply apparatus.

The power supply apparatus is placed in a casing, and, therefore, Joule heat generated by some components tends to accumulate in the casing. The diodes used in the input-side and output-side AC-to-DC converters and the power semiconductor device used in the inverter, in particular, generate a large amount of heat. A fan is disposed in the casing for the purpose of forcibly cooling such devices.

When this power supply apparatus is used with, for example, a welder or a cutter, of which the load includes a torch and a workpiece, it is used for a plurality of operation cycles. Each cycle consists of one running period in which the power supply apparatus operates in a running mode to generate an arc between the torch and the workpiece, and one pausing period in which the apparatus operates in a pausing mode. In the pausing mode, the apparatus is temporarily stopped. The time period of one cycle is predetermined for a particular apparatus. For example, it may be 10 minutes. Also, the proportion of the period of the running mode in one cycle (i.e. running ratio) is predetermined on the basis of the rating of the particular power supply apparatus.

Although the fan is driven to rotate in both the running and pausing periods, the power semiconductor devices including the above-mentioned diodes and semiconductor switching device, generate heat only during the running periods, causing the temperature in the casing to rise. During the pausing periods, the temperature within the casing rapidly decreases because the generation of heat by the power semiconductor devices is stopped and the fan is operating to cool the interior of the casing.

Experiments have revealed that the lifetime of power semiconductor devices decreases as the difference $\Delta Tc$ between the highest temperature and the lowest temperature during their operation increases. Temperature difference frequently occurs in a power supply apparatus for an arc welder or an arc cutter, in particular, which has a predetermined running ratio, which results in decrease of the lifetime of power semiconductor devices used therein. In addition, the power consumption of such power supply apparatus is large because the fan continuously operates even during a time interval between one welding operation and another or between one cutting operation and another, during which the fan need not be operated.

There is a power supply apparatus in which the temperature within the casing is measured, and the rotation of the fan is controlled in accordance with the measured temperature, so that unnecessary power consumption can be reduced. However, this arrangement cannot provide a solution to the reduction of the lifetime of diodes and semiconductor switching devices used in the apparatus.

The present invention is based on a discovery that power semiconductor devices can be used for a longer time as the difference between the highest and lowest temperatures to which they are subjected during operation is smaller. An object of the present invention is to prolong the lifetime of power semiconductor devices used in a power supply apparatus and reduce unnecessary power consumption of the apparatus.

SUMMARY OF THE INVENTION

A power supply apparatus according to the present invention includes a casing within which a power supply unit is housed. The power supply unit includes heat generating components including power semiconductor devices. A fan is provided for the casing to cool the heat generating components. A start switch is closed and opened alternately and repeatedly to thereby cause the power supply apparatus to operate in a plurality of operating cycles each consisting of one running period and one pausing period following the running period. Each cycle lasts a relatively short time period. Fan control means responds to the closure and opening of the start switch by operating and stopping the fan, respectively.

Thus, according to the present invention, the fan is operated while the power semiconductor devices of the apparatus are generating heat so that excessive temperature rise of the power semiconductor devices is prevented. The fan is stopped when the power supply apparatus is placed in the pausing mode. Therefore, the temperature of the semiconductor devices at the instant when the power supply apparatus is brought into the pausing mode is highest. Since the fan is not operating during the pausing mode, the temperature of the power semiconductor devices does not fall much. Thus, the temperature at the instant when the start switch of the power supply apparatus is next closed is lowest. Since the temperature difference between the highest and lowest temperatures is small, the lifetime of the semiconductor devices can be prolonged.

The fan control means may be switching means for coupling and decoupling a power source to and from the cooling fan. The power source for the fan may be an AC power source or a DC power source.

The cooling fan may operate upon receiving an AC signal. In this case, the fan control means is provided by converter means which converts a DC signal from the power supply unit into an AC signal in response to the closure of the start switch and supplies the resulting AC signal to the cooling fan. The converter means stops supplying the AC signal when the start switch is opened.

The fan control means may be arranged such that it does not stop the fan immediately after the start switch is opened, but it may allow the fan to rotate for a predetermined time period after the opening of the start switch.

BRIEF DESCRIPTION OF THE DRAWINGS

FIGS. 3(a) through 3(c) show waveforms for use in explaining the operation of the power supply apparatus, in which FIG. 3(a) shows running and pausing periods of the power supply apparatus, FIG. 3(b) shows a change of the temperature in a casing of the power supply apparatus, and FIG. 3(c) shows the ON and OFF states of a fan motor.

DESCRIPTION OF PREFERRED EMBODIMENTS

Figure 1:
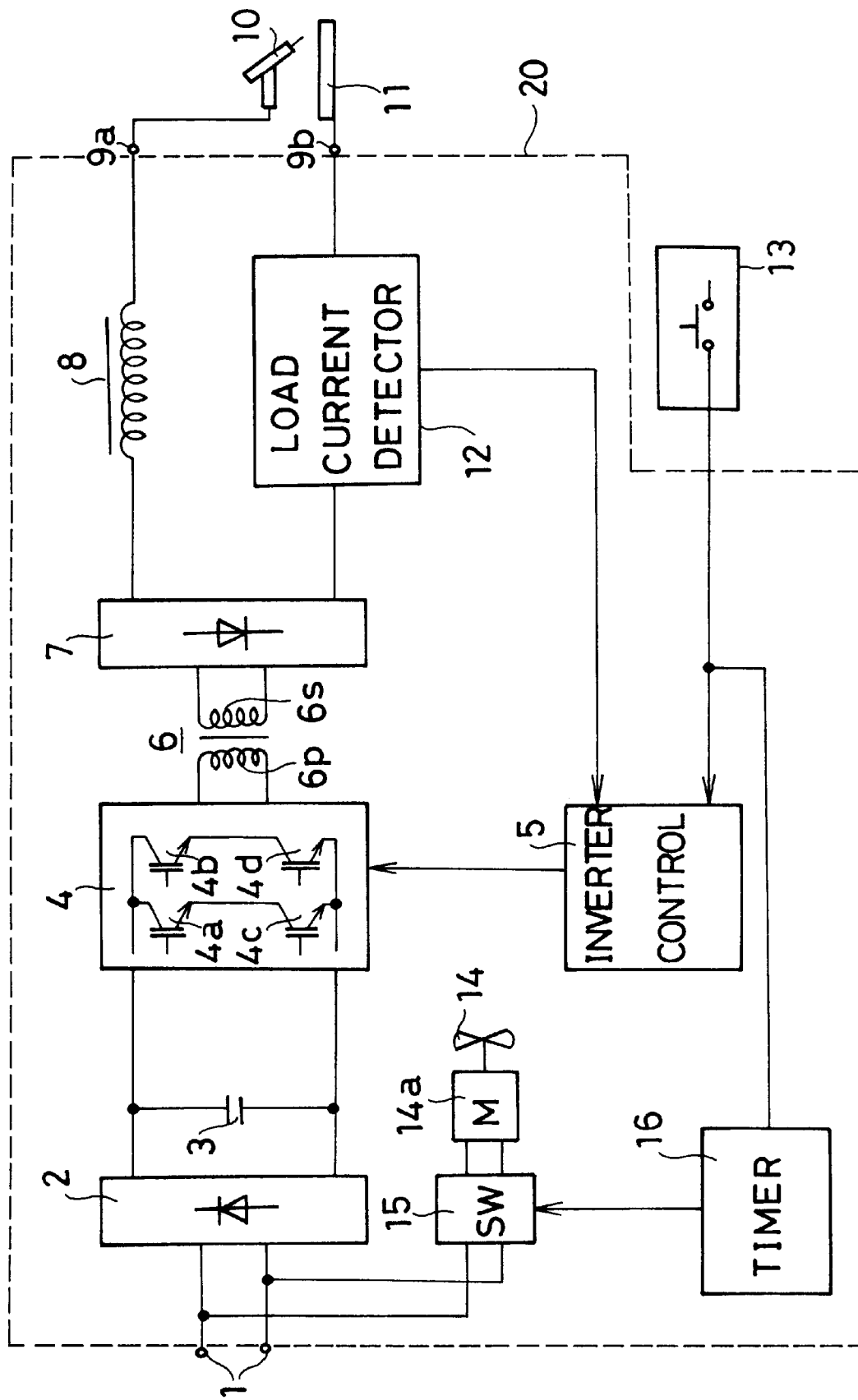
FIG. 1 is a block diagram of a power supply apparatus according to a first embodiment of the present invention.

A power supply apparatus according to a first embodiment of the present invention may be used with a welder and may include a power supply unit as shown in FIG. 1. An input-side rectifier 2 rectifies an AC voltage, e.g. a single-phase commercial AC voltage, supplied to the power supply apparatus at input terminals 1 and coupled to the rectifier 2 via a power supply switch (not shown). The input-side rectifier 2 may be a full-wave rectifier circuit or a half-wave rectifier circuit. The output voltage from the input-side rectifier 2 is smoothed and converted into a DC voltage by smoothing means, e.g. a smoothing capacitor 3.

The DC voltage is, then, applied to DC-to-AC converter means, e.g. an inverter 4, which may include a full-bridge circuit including semiconductor switching devices 4a, 4b, 4c and 4d. The switching devices 4a–4d are PWM controlled by an inverter control circuit 5, with one pair of semiconductor switching devices 4a and 4d being alternately turned and off when the other pair of switching devices 4b and 4c are alternately turned off and on, which results in the conversion of the inputted DC voltage into a high-frequency voltage.

The high-frequency voltage is then applied across a primary winding 6P of a relatively small-sized high-frequency transformer 6. As a result, a high-frequency voltage having a predetermined magnitude is induced across a secondary winding 6S. The high-frequency voltage induced across the secondary winding 6S is rectified by an output-side rectifier 7, which may be a full-wave rectifier circuit or a half-wave rectifier circuit. The output of the output-side rectifier 7 is smoothed and converted to a DC voltage by smoothing means, e.g. a smoothing reactor 8.

The DC voltage from the reactor 8 appears between output terminals 9a and 9b of the power supply apparatus and can be applied between a torch 10 and a workpiece 11 which form a load.

The input-side rectifier circuit 2 and the output-side rectifier circuit 7 each include a semiconductor device, e.g. a diode. Also, the inverter 4 may include, as the semiconductor switching devices 4a, 4b, 4c and 4d, power semiconductor devices, for example, thyristors, bipolar transistors or IGBTs. When operating, they generate heat.

For an AC load, the DC voltage developed between the output terminals 9a and 9b is converted to an AC voltage again in an inverter or the like (not shown) for application to the AC load.

The current applied to the load is detected by a load current detector 12, which develops a load current representative signal representing the magnitude of the load current. The load current representative signal is applied to the inverter control circuit 5, where it is compared with a reference signal. The inverter control circuit 5 PWM controls the inverter 4 in such a manner as to make the load current representative signal equal to the reference signal, i.e. to make the load current constant.

A start switch 13 is coupled to the inverter control circuit 15. The power supply unit starts to run when the start switch 13 is closed, and pauses when the start switch 13 is opened. The start switch 13 may be disposed on, for example, the torch 10. The power supply unit, except the start switch 13, the torch 10 and the workpiece 11, are disposed in a casing 20. A fan 14 is disposed within the casing 20 for cooling the power semiconductor devices of the input-side rectifier circuit 2, output-side rectifier circuit 7 and inverter 4. Fan control means, e.g. a switch 15, is connected between a fan driving motor 14a for the fan 14 and the AC power input terminals 1. The switch 15 is ON-OFF controlled by a timer 16. The timer 16 operates to close the switch 15 when the start switch 13 is closed and opens the switch 15 a predetermined time after the start switch 13 is opened.

Figures 3A, 3B, 3C:
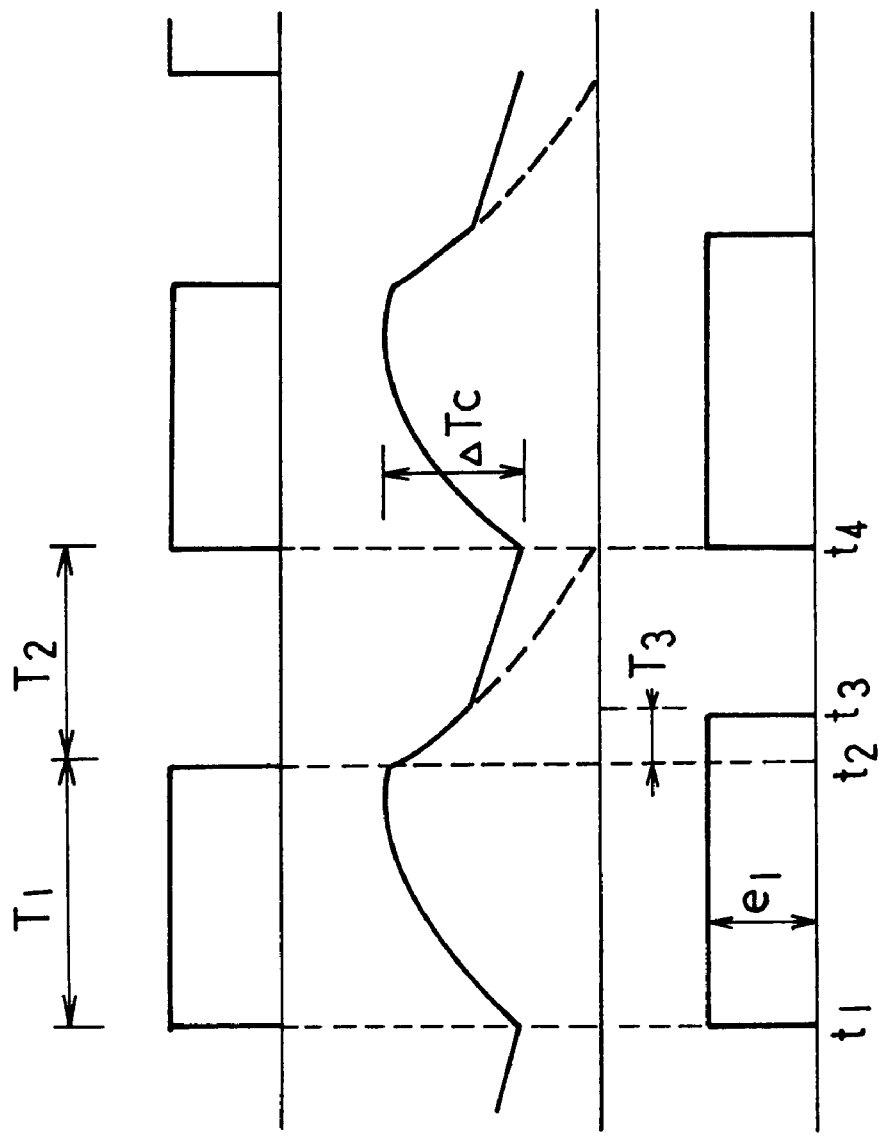

When the start switch 13 is closed at a time t1 as shown in FIG. 3(a), the power supply unit is placed in a running mode of operation, in which the inverter control circuit 5 ON-OFF controls the semiconductor switching devices 4a–4d of the inverter 4, and current flows through the load. In response to the closure of the start switch 13, the timer 16 closes the switch 15 so as to supply an AC voltage e1 to the motor 14a of the fan 14 as shown in FIG. 3(c). Accordingly, the fan 14 rotates at a rate determined by the magnitude of the AC voltage e1. Due to the operation of the fan 14, the temperature rise in the casing 20 is gradual as shown in FIG. 3(b). If the fan 14 were not operated, the temperature within the casing 20 would rise more rapidly.

At a time t2, after a time period T1 from the time t1, the start switch 13 is opened to terminate the running mode, and the inverter control circuit 5 turns off the semiconductor switching devices 4a–4d of the inverter 4. Then, no current is supplied to the load. In other words, the power supply unit is placed in a pausing mode of operation. The timer 16 measures a predetermined time period T3 from the time t2 and opens the switch 15 at a time t3 which is T3 after the time t2. This causes the application of the AC voltage e1 to the fan motor 14a to be interrupted as shown in FIG. 3(c), and the fan 14 stops rotating.

Since the fan 14 continues to rotate for the time period T3, from the time t2 to the time t3, the temperature within the casing 20 decreases. However, since the fan 14 stops rotating after that, the temperature within the casing 20 decreases by a smaller amount than when the fan 14 would be continuously rotated as indicated by a broken line slope in FIG. 3(b).

At a time t4, when the time period T2 starting at the time t2 has lapsed, the start switch 13 is closed again to initiate the running mode, and the inverter 4 resumes operating, which results in a gradual rise of the temperature within the casing 20. The operation is repeated after that.

The lengths of the time periods T1 and T2, which constitute one cycle, are determined by the running ratio of the welder or cutter for which the power supply apparatus is used. The sum T1+T2 may be, for example, 10 minutes.

Figure 2:
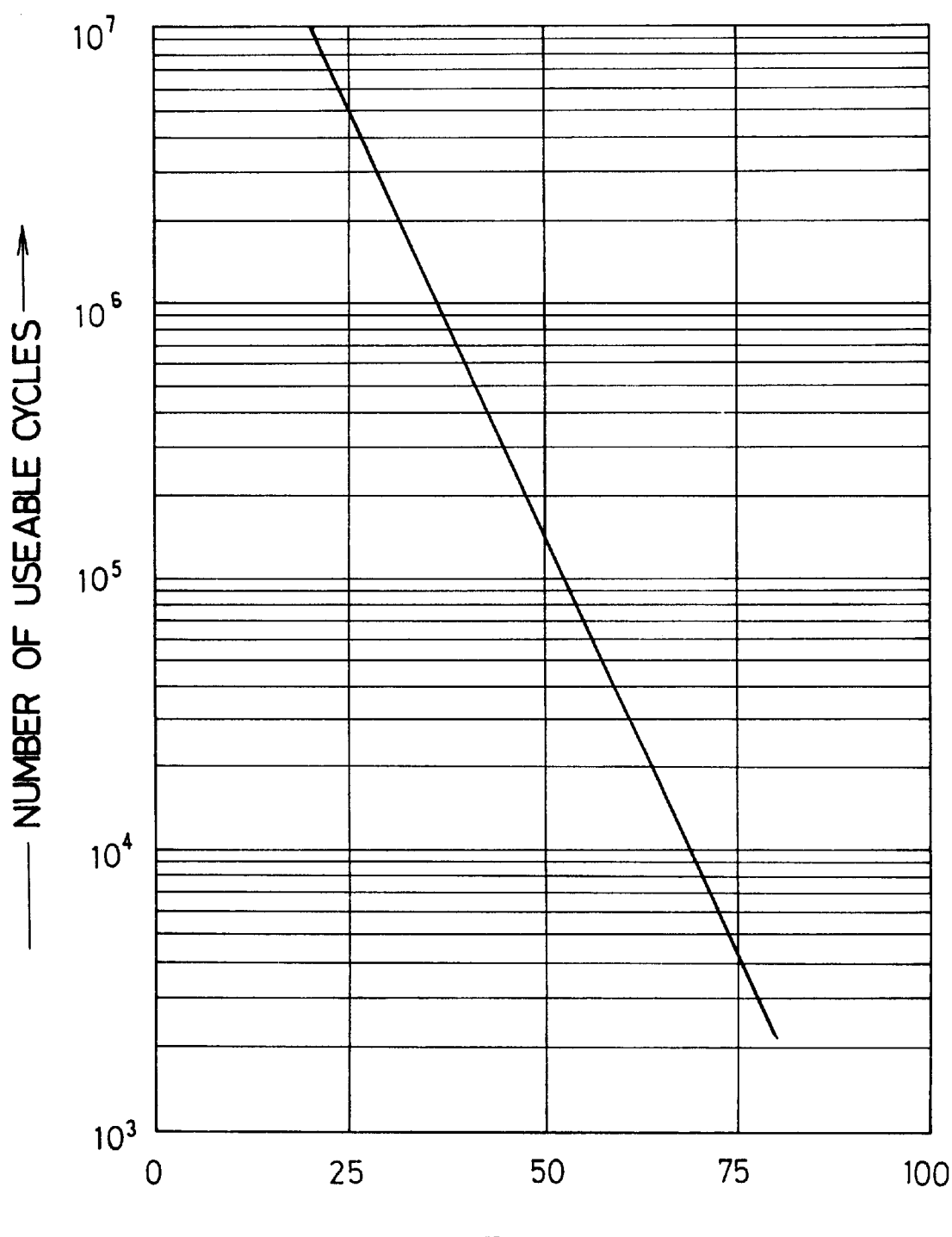
FIG. 2 shows the lifetime of a power semiconductor device in relation to the difference between highest and lowest temperatures to which the semiconductor device is subjected.

As shown in FIG. 3(b), there is a difference ΔTc between the highest temperature and the lowest temperature within the casing 20 when the power supply apparatus is being operated. The lowest temperature is the temperature when the start switch 13 is closed. Experiments conducted by the inventors have revealed that there is a relationship as shown in FIG. 2 between the number of the operating cycles of the power supply apparatus the power semiconductor devices of circuits, such as the inverter 4, can be used (hereinafter referred to as useable cycles), i.e. the lifetime of the power semiconductor devices, and the temperature difference $\Delta Tc$.

It is seen that as the temperature difference $\Delta Tc$ becomes larger, the lifetime of power semiconductor devices becomes shorter. For example, when $\Delta Tc$ is about 35° C., the number of the useable cycles is $10^6$. If the fan 14 is driven continuously, resulting in $\Delta Tc$ of, for example, about 75° C., the number of the useable cycles is $4 \times 10^3$. It will be understood that the number of the useable cycles the power semiconductor devices can be used become larger when the fan 14 is stopped at intervals than when it is continuously driven.

Thus, according to the present invention, the operation of the fan 14 is stopped the predetermined time T3 after the start switch 13 is opened, to thereby prevent increase of the temperature difference $\Delta Tc$. Since the fan is not operated continuously, but it is driven or stopped in relation to the operation of the start switch 13, unnecessary power consumption can be avoided.

In order to minimize the temperature difference $\Delta Tc$, it is desirable to stop the fan 14 immediately after the start switch 13 is opened. According to the present invention, therefore, the fan 14 may be stopped at the same time the start switch 13 is opened.

On the other hand, if the fan 14 is stopped at the same time the start switch 13 is opened, the temperature of the junction of the semiconductor switching devices may exceed their allowable junction temperature. If the allowable junction temperature of a semiconductor switching device is exceeded, the semiconductor switching device can be used no longer. Therefore, as described previously, the fan 14 is kept operating for the time period of T3 after the start switch 13 is opened, to thereby cool the semiconductor switching devices.

Figure 4:
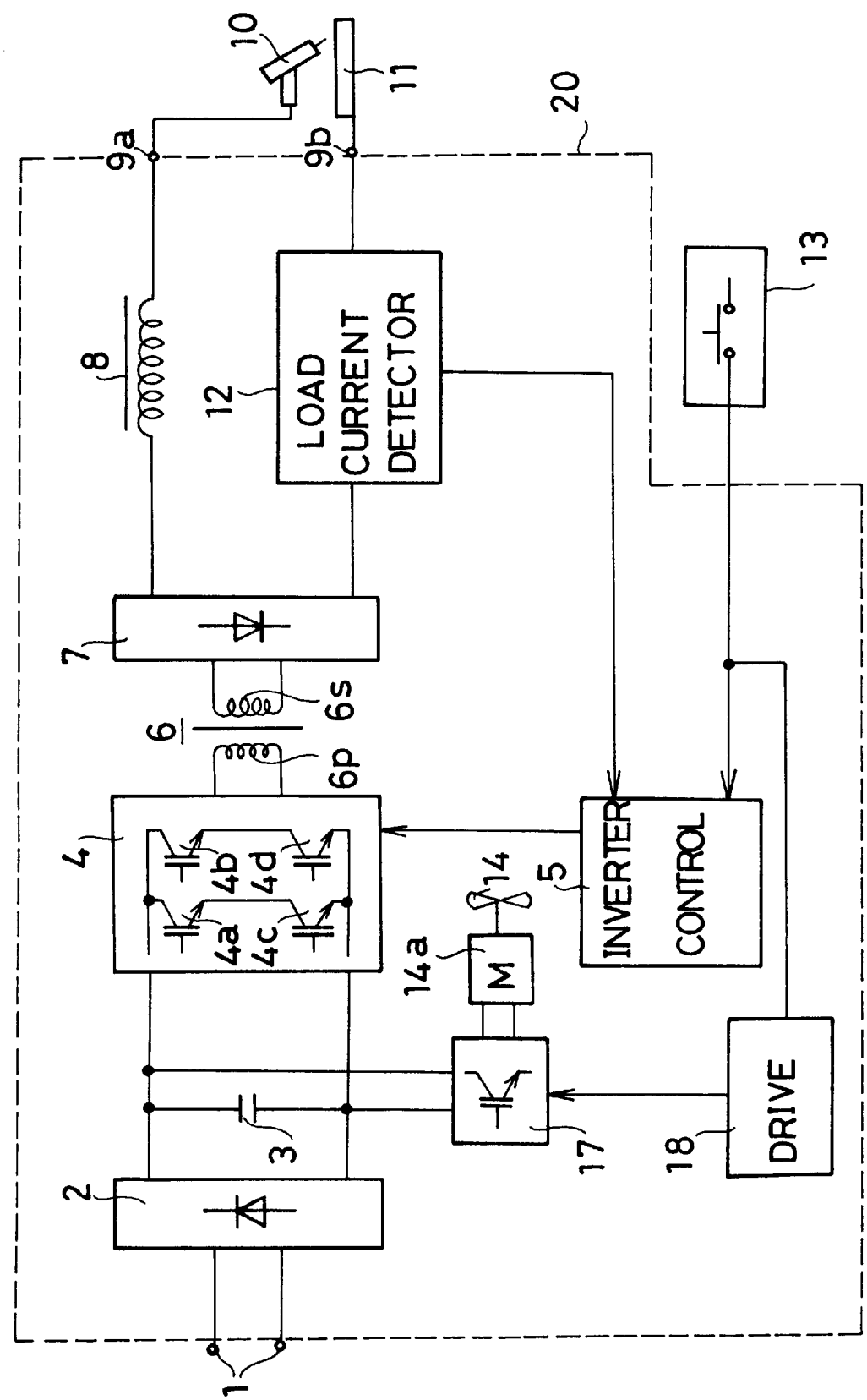
FIG. 4 is a block diagram of a power supply apparatus according to a second embodiment of the present invention.

A power supply apparatus according to a second embodiment is shown in FIG. 4. Components with the reference numerals or symbols same as the ones used in FIG. 1 are the same components as used in the first embodiment, and, therefore, no further description is made about them.

In the first embodiment, the switch 15 is connected between the fan 14 and the AC power input terminals 1 as shown in FIG. 1. According to the second embodiment, AC power for the fan 14 is prepared by converting means including an inverter, e.g. a rotation rate control unit 17, which converts the DC voltage across the smoothing capacitor 3 into an AC signal, e.g. an AC voltage. The rotation rate control unit 17 is controlled by a driving unit 18. The driving unit 18 causes the rotation rate control unit 17 to generate an AC voltage of a predetermined value for rotating the fan 14 when the start switch 13 is closed.

When the start switch 13 is opened, the driving unit 18 causes the rotation rate control unit 17 to stop generating the voltage so that the fan 14 is stopped. Of course, as in the first embodiment, it may be so arranged that the fan 14 keeps rotating for a predetermined time period after the opening of the start switch 13 before it is stopped.

Alternatively, it may be so arranged that the fan 14 may be rotated at a lower rate for a predetermined time period after the opening of the switch 13.

The present invention has been described as being embodied in a power supply apparatus which is used with a welder. However, it may be embodied in a power supply apparatus useable with other apparatuses, such as a cutter and a projector, which alternates between a running mode and a pausing mode in a plurality of contiguous cycles each having a relatively short time period. Also, the motor 14a for rotating the fan 14 may be a DC motor.

What is claimed is:

1. A power supply apparatus comprising:

a casing;

a power supply unit, including heat generating components including a power semiconductor device, disposed in said casing;

a cooling fan disposed in said casing for cooling said heat generating components;

a start switch, when closed, enabling said power supply unit to operate for a first predetermined time, and, when opened, disabling said power supply unit for a second predetermined time, the closing and opening of said start switch alternating with each other; and a timer responsive to the closure of said start switch for enabling said cooling fan to operate, said timer disabling said cooling fan a third predetermined time after the opening of said start switch, said third predetermined time being shorter than said second predetermined time during which said power supply unit is disabled.

2. The power supply apparatus according to claim 1 wherein said timer controls opening and closing of a switch interposed between an AC power supply for said power supply apparatus and said cooling fan.

3. A power supply apparatus comprising:

a casing;

a power supply unit disposed in said casing, for converting a first AC signal to a DC signal, said power supply unit including heat generating components including a power semiconductor device;

a cooling fan disposed in said casing and operated from a second AC signal for cooling said heat generating components;

a start switch, when closed, enabling said power supply unit to operate, and, when opened, disabling said power supply unit for a given time, the closing and opening of said start switch alternating with each other; and fan control means for converting said DC signal to said second AC signal and supplying said second AC signal to said cooling fan in response to the closing of said start switch, and disabling said cooling fan a predetermined time after the opening of said start switch, said predetermined time being shorter than said given time during which said power supply unit is disabled.

* * * * *